(12) United States Patent  (10) Patent No.: US 7,795,647 B2
Storaska et al.  (45) Date of Patent: Sep. 14, 2010

(54) CURLED SEMICONDUCTOR TRANSISTOR

(75) Inventors: Garrett A. Storaska, Reston, VA (US);
Robert S. Howell, Wheaton, MD (US);
Harvey C. Nathanson, Pittsburgh, PA (US); Francis William Hopwood, Severna Park, MD (US)

(73) Assignee: Northrop Grumman Systems Corporation, Los Angeles, CA (US)

( * ) Notice: Subject to any disclaimer, the term of this patent is extended or adjusted under 35 U.S.C. 154(b) by 366 days.

(21) Appl. No.: 11/727,955

(22) Filed: Mar. 29, 2007

(65) Prior Publication Data

US 2007/0284633 A1  Dec. 13, 2007

Related U.S. Application Data

(63) Continuation-in-part of application No. 10/861,885, filed on Jun. 7, 2004, now Pat. No. 7,488,994.

(60) Provisional application No. 60/532,175, filed on Dec. 24, 2003, provisional application No. 60/476,200, filed on Jun. 6, 2003.

(51) Int. Cl.
*H01L 29/76* (2006.01)
(52) U.S. Cl. .................. 257/213; 257/401
(58) Field of Classification Search .................. 257/213, 257/401, E27.06
See application file for complete search history.

(56) References Cited

U.S. PATENT DOCUMENTS 6,051,877 A  4/2000 Usami et al.
6,183,267 B1  2/2001 Marcus et al.
6,464,687 B1  10/2002 Ishikawa et al.
2002/0018334 A1  2/2002 Hill et al.
2002/0125545 A1  9/2002 Kano et al.
2003/0057525 A1  3/2003 Fock et al.
2007/0278527 A1*  12/2007 Kasama et al. .............. 257/206

FOREIGN PATENT DOCUMENTS

| CA | 2305069 | 10/2001 |
| EP | 1231617 | 8/2002 |
| EP | 1241507 | 9/2002 |
| WO | WO 01/81173 | 11/2001 |
| WO | WO 01/88612 | 11/2001 |
| WO | WO 02/36486 | 5/2002 |

OTHER PUBLICATIONS

Celler, G.K., et al, Frontiers of silicon-on-insulator, J. Applied Physics, May 1, 2003, 4955-4978, vol. 93, No. 9.
Gill, John J., et al., "Manufacturing issues of thin film NiTi microwrapper, Sensors and Actuators", Elsevier Sequoia, S.A., Lausanne, Ch., Sep. 30, 2001, 148-156, vol. 93, No. 2.
International Search Report, PCT/US2004/017952, Jul. 6, 2004.
Written Opinion, PCT/US2004/017952, Jul. 6, 2004.

* cited by examiner

*Primary Examiner*—Thien F Tran
(74) *Attorney, Agent, or Firm*—Andrews Kurth LLP

(57) ABSTRACT

A curled transistor comprises a coiled semiconductor substrate having a plurality of concentrically curled layers. Source and drain regions are configured on a portion of the coiled semiconductor substrate, and a gate dielectric is positioned between the source and drain regions. A first set of metallic contacts electrically couple to the source region on the coiled semiconductor substrate and a second set of metallic contacts electrically couple to the drain region on the coiled semiconductor substrate.

21 Claims, 16 Drawing Sheets

FABRICATION OF NANOCOIL RFMOS AND
SILICON CIRCUITRY ON SOI CONFIGURATION
(CONTINUED)

CURLED SEMICONDUCTOR TRANSISTOR

REFERENCE TO RELATED APPLICATION(S)

This application is a continuation-in-part (CIP), under 35 U.S.C. §120, of U.S. application Ser. No. 10/861,885, entitled "Coiled Circuit Device and Method of Making the Same," filed Jun. 7, 2004 now U.S. Pat. No. 7,488,994, which claims priority under 35 U.S.C. §119(e) to U.S. Provisional application No. 60/476,200, filed on Jun. 6, 2003, and to U.S. Provisional application No. 60/532,175, filed on Dec. 24, 2003, all of which are incorporated herein by reference in their entirety.

FIELD OF THE INVENTION

The invention relates generally to electronic devices, specifically to a curled semiconductor transistor and method for fabricating the same.

BACKGROUND OF THE INVENTION

RF transistors are designed to handle high-power radio frequency (RF) signals in devices such as stereo amplifiers, radio transmitters, television monitors and other devices. RF transistors consist of an N-type or P-type layer sandwiched between two layers of the opposite type. Like other semiconductor devices, RF transistors are made of semiconductor materials such as silicon (Si), silicon-germanium (SiGe), Galium Arsenide (GaAs), etc. and doped with impurities to induce changes in electrical properties. The junctions between the semiconductor sections cause a weak input to be amplified. Varying the current between a gate and a source of the transistor varies the current flow between the source and the drain.

A power metal oxide semiconductor (MOS) or bipolar transistor switch or amplifier, fabricated on a wafer, has a large periphery or surface area. The large periphery is required to maintain a high device current and a low 'on' state device impedance. Such large periphery devices can have significant common area with the substrate, since the device source and drain contacts must have reasonable width for low resistance contacting. Because of this large periphery, RF transistors suffer from losses, due to parasitic capacitances when integrated on silicon foundry substrates, particularly on highly doped substrate regions. The extensive area to the substrate causes high coupling to the ground plane, which contains lossy silicon doped material. The capacitive losses can lead to degradation in RF performance, such as RF power max-frequency (Fmax) performance.

SUMMARY OF THE INVENTION

A curled transistor comprises a coiled semiconductor substrate having a plurality of concentrically curled layers. Source and drain regions are configured on a portion of the coiled semiconductor substrate, and a gate dielectric is positioned between the source and drain regions. A first set of metallic contacts electrically couple to the source region on the coiled semiconductor substrate and a second set of metallic contacts electrically couple to the drain region on the coiled semiconductor substrate.

DETAILED DESCRIPTION

In accordance with an embodiment, a long flat MOS transistor device may be released from a substrate through undercut etching or other releasing technique. Because of constrictive stresses of a nitride layer on top of a portion of the transistor device, the transistor device may self-curl into a tightly-wound tube or cylinder (e.g., with a diameter of several microns and a length ranging from several microns to hundreds of microns per transistor). Integrated circuit (IC) connections to the source, drain and gate may remain flatly attached to the substrate. Optionally, metal bumps or contacts are positioned, between respective metal source/drain contacts, to provide increased electrical and thermal connection between successive wrapped layers of the curled device. Optionally or additionally, a similar technique using feed through bumps in the gate of the device may assure radial gate contact, shorting out the gate spiral to the outermost gate contact turn. In this manner, all of the source, gate and drain contacts are electrically connected to their respective flat pads on the silicon IC surface. The end contacts may form a single small quasi-solid source and drain contact, which can be used to shunt the thermal power dissipation of the device to thermal ground. Nanocoil curled or coiled transistors may be fabricated, as described herein. The curled transistor may have many applications, such as RF and power transistor applications.

Nanocoils are coiled circuits, including memory devices and other circuits. Nanocoils have great potential for super dense memory and power FET applications due to nanocoils' enormous surface storage and periphery area to volume ratio. Previously, a 100× improvement in surface area/volume ratio over conventional planar technology has been experimentally realized by using stress ridges to force concentric coiling on polycrystalline Si coil.

As described herein, conventional technologies in the areas of microscopic electro-mechanical systems ("MEMS") electrostatic switches and radio-frequency ("RF") devices may be improved using the nanocoil curled transistors. As with improvement shown over planar memory, conventional MEMS electrostatic switch and RF device technologies may be drastically improved upon.

Figure 1:
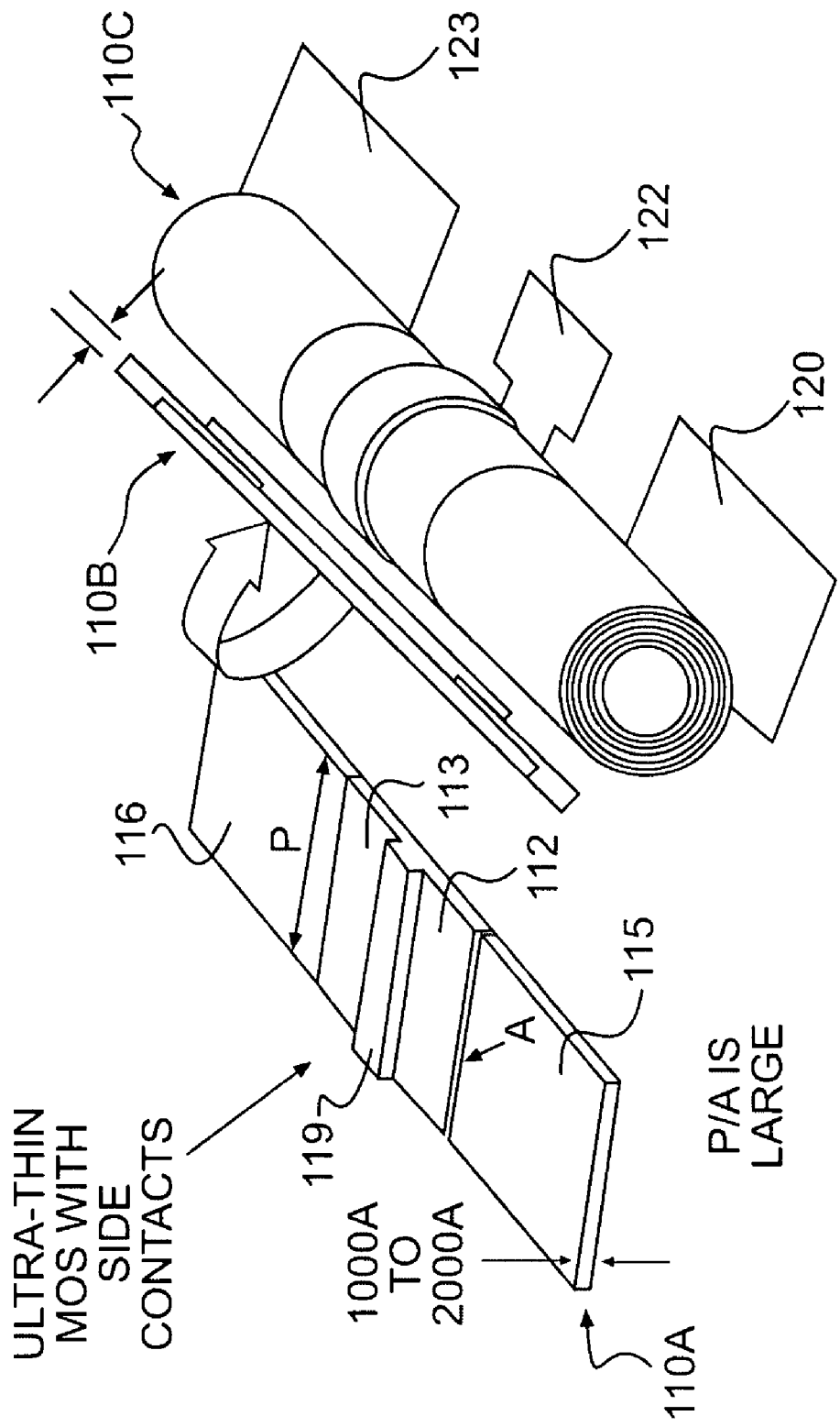
FIG. 1 illustrates a nanocoil based curled transistor, in accordance with an embodiment.

FIG. 1 illustrates a nanocoil-based transistor in accordance with an embodiment. The transistor may be a power metal oxide semiconductor field effect transistor (MOSFET), a bipolar transistor or other type of transistor. The transistor may be N-type or P-type. FIG. 1 shows a portion of an uncoiled or uncurled nanocoil-based transistor 110A. FIG. 1 also shows the nanocoil-based transistor as it is being coiled 110B and in its final coiled state 110C.

Figure 12:
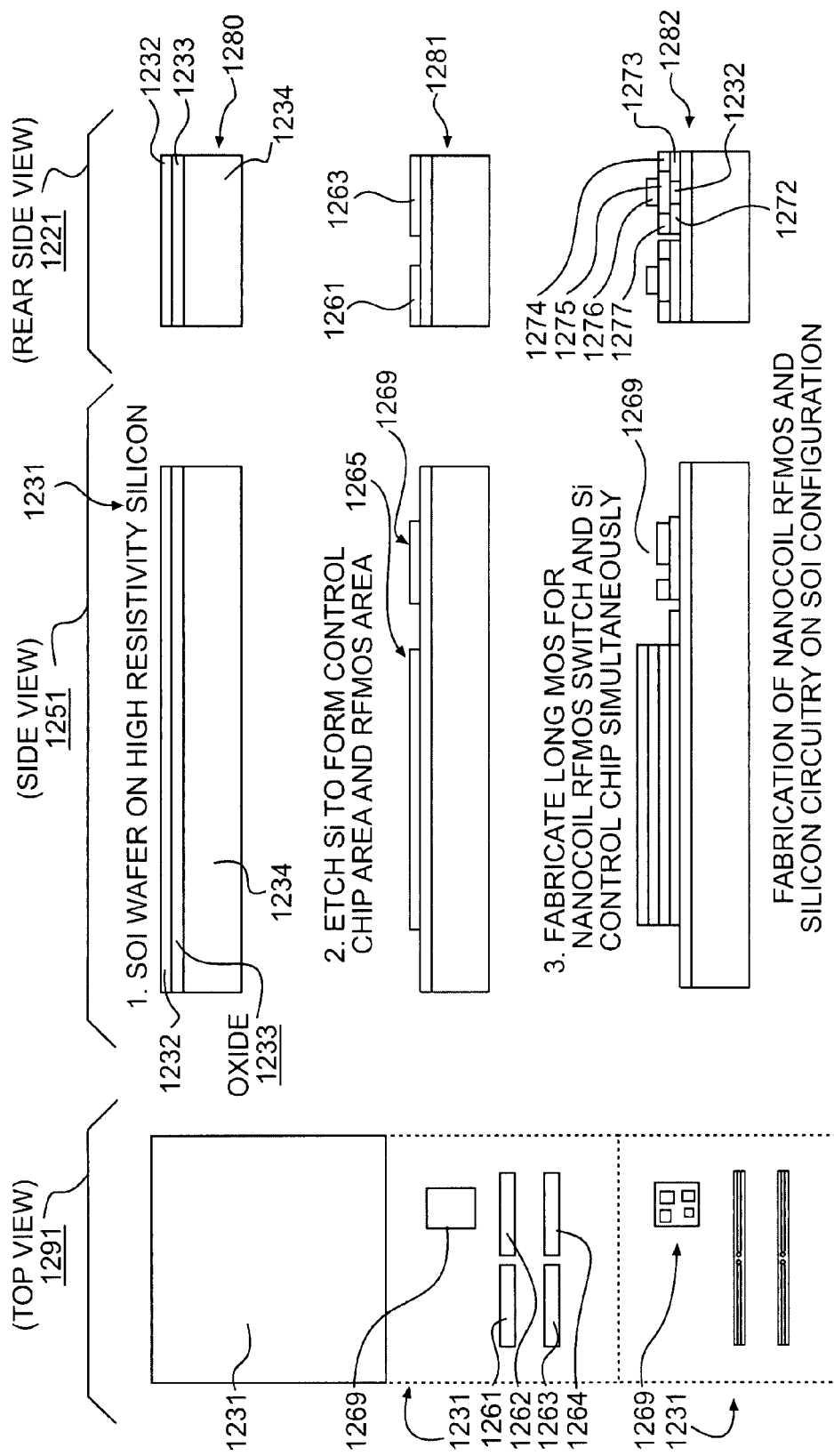
FIGS. 12 and 13 illustrate a process for fabricating a nanocoil curled transistor, in accordance with an embodiment.
Figure 13:
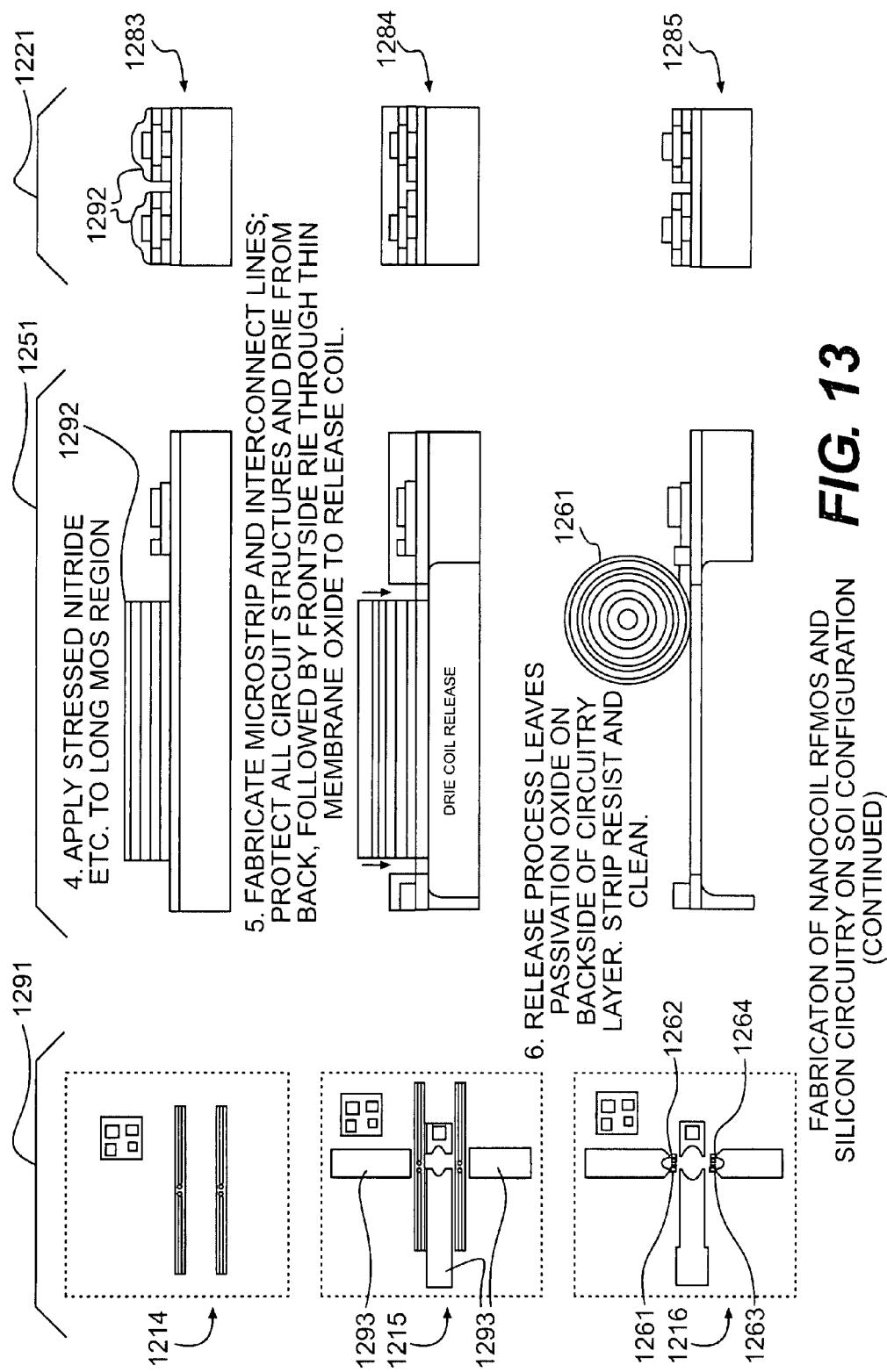

As can be seen in the uncoiled portion of the nanocoil transistor 110A, the transistor includes a source region 112, drain region 113, and contact ends 115 and 116 coupled to the source and drain regions, respectively. The entire transistor including the source and drain regions of the transistor are located under, for example, a stressed nitride layer (as shown in FIGS. 12 and 13), which initiates the curling or coiling action. Section 110A of the uncoiled nanocoil transistor also shows a silicon gate 119 which is also under the stressed nitride layer. Alternately, a different stressed layer other than nitride could be employed to initiate curling (e.g., silicon germanium, titanium nitride (TiN), tungsten (W), and poly-imide (PI). The uncoiled nanocoil device thickness may range between 50 angstroms (Å) to 10,000 Å. As the section 110A is curled, as shown by 110B, it forms a tight concentric coil, shown by the curled transistor 110C. External source contacts 120, drain contacts 123 and gate contacts 122 are provided.

The number of curls or coils in a nanocoil transistor may depend on the desired characteristics of the coiled nanocoil transistor. For example, the area of the uncoiled transistor, the stresses on the materials, and the materials chosen may determine the number of curls in the nanocoil transistor as well its electrical performance. The curled transistor, as described herein, may also be referred to as a curled or rolled transistor.

Figure 2:
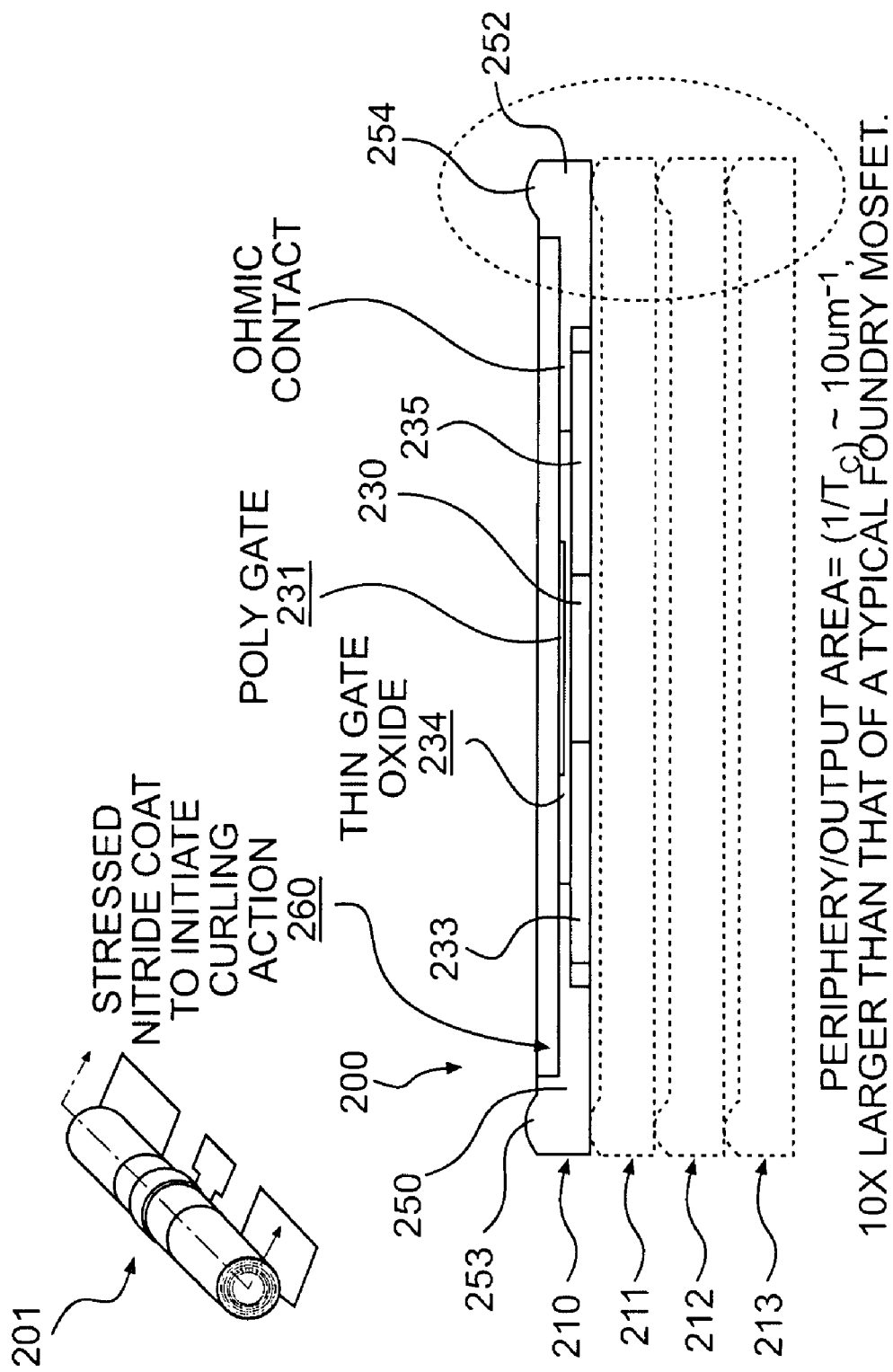
FIG. 2 illustrates a cross-sectional portion of a curled portion of a curled transistor.

FIG. 2 illustrates a cross sectional cutout 200 of a curled transistor 201, which is a "stress wound" curled transistor. As an example, section 200 is a side view of four layers 210, 211, 212 and 213 of the curled transistor 201, which may include the features of the nanocoil transistor shown in FIG. 1. Layer 210 shows the various components that make up each layer of the curled transistor 201. Layer 210 includes an underlying semiconductor substrate 230. The semiconductor substrate 230 may be, for example, a single crystal silicon on oxide (SOI), a poly-crystalline silicon or another material. The semiconductor substrate 230 may include source region 233 and drain region 235. A gate oxide 234 may be disposed over portions of the source, drain and substrate, as shown. A gate dielectric 231 may be positioned between the source and drain regions, as shown. The gate dielectric may be a poly silicon gate disposed over a portion of the thin gate oxide 234. Metal contacts 250, and 252 may be electrically coupled to the source and drain regions 233, 235, respectively. The metal contacts 250 and 252 may be gold (Au) or may be other metals, such as aluminum (Al), chromium (Cr), titanium (Ti), W, copper (Cu) and their various alloys or combinations thereof.

In an embodiment, to improve the layer to layer contact between source and drain regions 233, 235 of the curled transistor, raised metallic bump-outs 253 and 252 may be applied, at intervals, along the length of the uncoiled transistor device, either by evaporation or plating. The raised metallic bump-outs 253, 254 may be manufactured into the metal contacts 250, 252 or may be applied at a later time. In an embodiment, the raised bump-outs may be about 200 Å to 500 Å in height (e.g., above the metal contacts 250, 252) and may be include metals described above. The raised metallic bump-outs 253, 254 may provide pressure point extensions around the curled transistor device periphery which cause layer-to-layer electrical contact, via the metal contacts 250, 252, in the source 233 and drain 235 contact regions, as shown in FIG. 2. A silicon nitride stress layer 260 may be deposited on one or more layers of the curled transistor 201. The silicon nitride stress layer 260 may initiate the curling action 260. The silicon nitride stress layer may be ubiquitous except for the regions where the bump-outs 253, 254 "peek through," thus causing the uncoiled transistor structure (e.g., 110A) to curl, due to internal atomic stresses. The bump-outs 253, 254 may be configured to provide thermal conductivity between layers (e.g., layers 210-213), such as the semiconductor substrate 230.

These devices are designed for a periphery to output area ratio of $10um^{-1}$, an excellent value for RF switches, and about a factor of perhaps 10× to 20× better than other semiconductor foundry MOS devices being considered for High $F_{CO}$ switching. This high P/A also maximizes the output bandwidth of the structure as a Power FET, for example.

Figure 3:
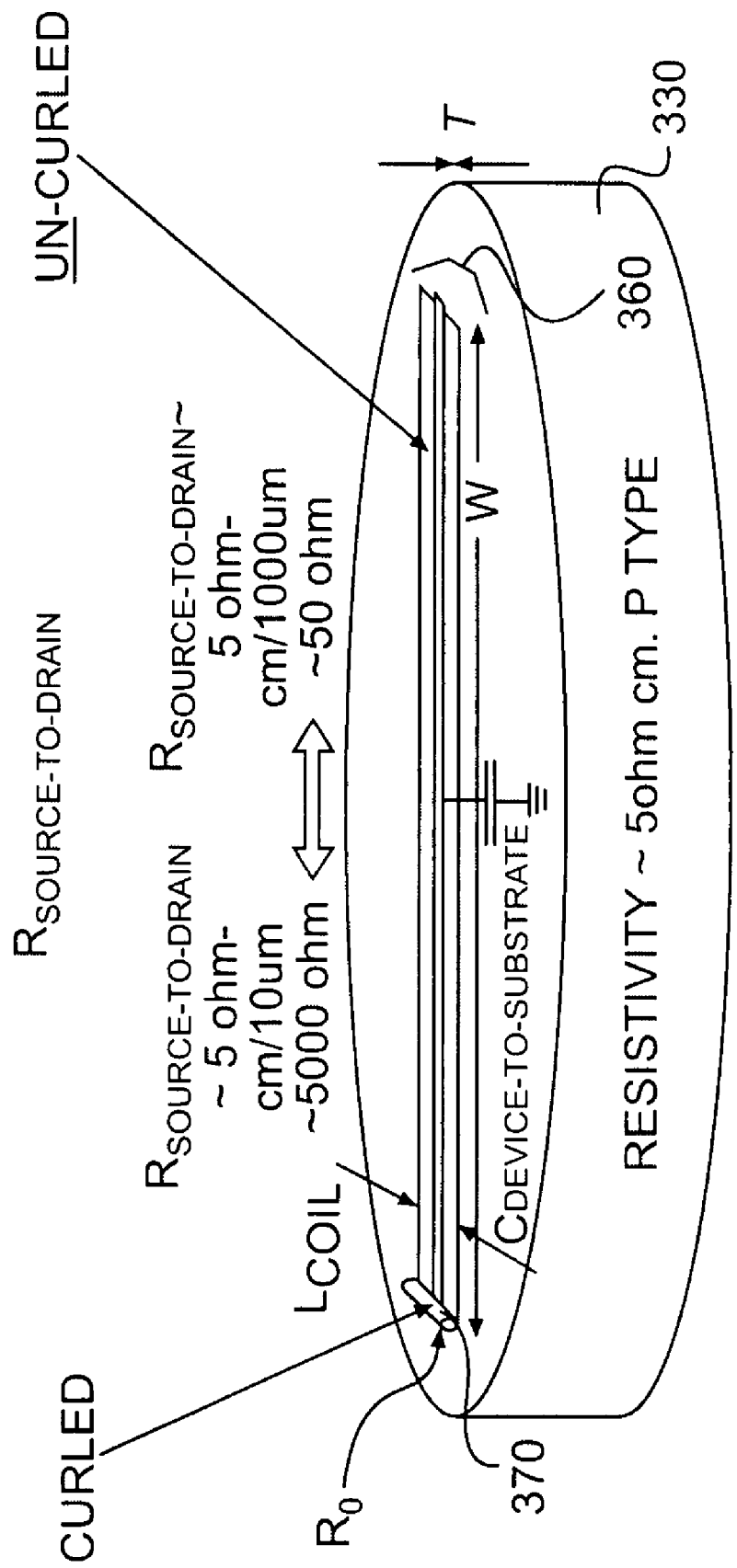
FIG. 3 illustrates an uncurled transistor device and a curled transistor device on a substrate.

FIG. 3 illustrates an uncurled transistor device 360 and a curled transistor device 370 on substrate 330. The transistor device may be fabricated on substrate 330, which may be a P type silicon-on-insulator (SOI) substrate having a resistivity of approximately 5 Ohms cm with a buried oxide of 1000 Å beneath a top silicon layer 1000 Å thick.

As can be seen in FIG. 3, the uncurled transistor device 360 has a device length W, a device thickness T, and width Lcoil. The curled device 370 has a radius Ro and diameter D. The uncurled transistor 360 has a large periphery and thus a significant common area ($L_{coil}$×W) with the substrate 330. The width Lcoil of the uncurled device (or the length Lcoil of the curled device) may include the length of the source, the length of the source contact, the length of the drain, length of the drain contact, and the length of the gate. These length measurements associated with the coil are measured in the perpendicular direction to coiling.

The long periphery of uncurled device 360 results in a large feed through capacitance to the substrate 330. Additionally, the capacitance from the source to drain contacts of the uncurled transistor device 360 is enlarged by the presence of the high permittivity silicon substrate. These effects increase the capacitance when transistor devices are integrated on silicon substrates. The device-to-substrate capacitance of an uncurled device 360 can be over twenty five times that of a curled device 370. In addition, the source to drain resistance of the uncurled device 370 is approximately hundred times less that for a uncurled device 360. Thus, curled transistors, as described herein, offer significant advantages over uncurled or conventional transistors.

Figure 4:
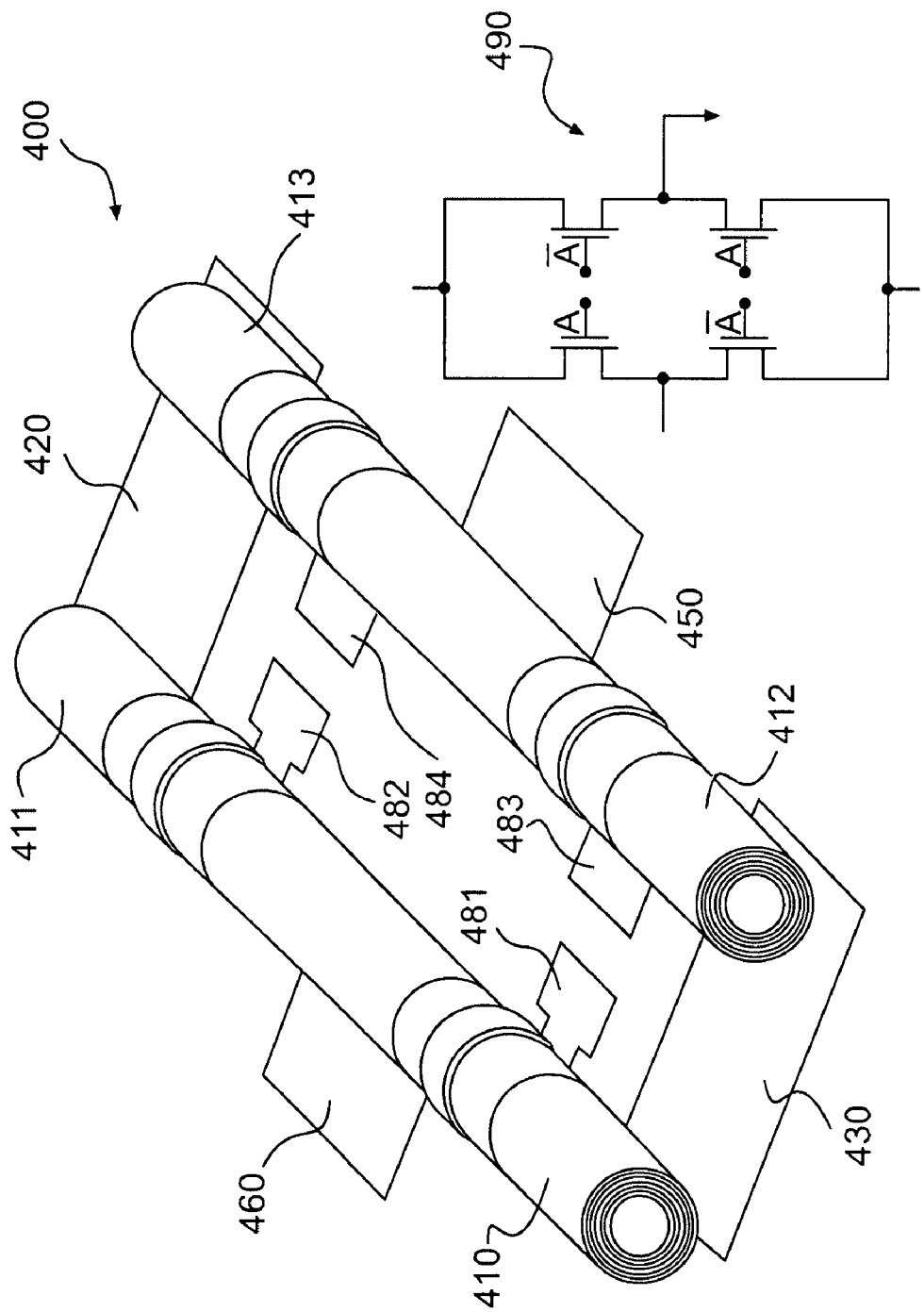
FIG. 4 illustrates a curled transistor arrangement, in accordance with an embodiment.

Curled transistors, fabricated in accordance with an embodiment of the invention, are extremely small and can be readily fabricated, making curled transistor devices suitable for use in complicated configurations. For example, FIG. 4 illustrates a curled transistor arrangement 400, which may have an electrical configuration suitable for series/shunt high isolation switching for, RF microwave True Time Delay (TTD) arrays. As shown, the curled transistor arrangement 400 includes four curled transistors 410, 411, 412, and 413, with gates 481, 482, 483 and 484, respectively. As can be seen, the source contacts of curled transistors 410, 412 may be coupled as a common source 430. The drain contacts of curled transistors 411, 413 may be coupled as a common drain 420. The respective drain and source contacts of transistors 410 and 411 may be coupled as the input of the switch arrangement 400. The respective drain and source contacts of transistors 412 and 413 may be coupled as the output of the curled transistor arrangement 400. As shown in FIG. 4, 490 illustrates the circuit configuration equivalent of the switch arrangement 400.

A four transistor arrangement, such as arrangement 400, made monolithically from four 1000μm long (uncurled strip length) MOSFETS with a contact and active region width of approximately 43 microns as above, has an uncurled MOS footprint of 4×1000 μm×43 μm=172000 μm². Comparatively, the curled four switch arrangement 400, as shown in FIG. 4, has a device footprint to the substrate of approximately 4×12.2 μm×43 μm=2100 μm², a smaller footprint by a factor of 83 as compared to the uncurled four switch device structure (not shown). The curled configuration may lead to a significantly decreased common mode capacitance to ground, and thus significantly decreased RF losses.

In accordance with an embodiment, the curled transistor arrangement may include other configurations and may include any number of curled transistors.

Figure 5:
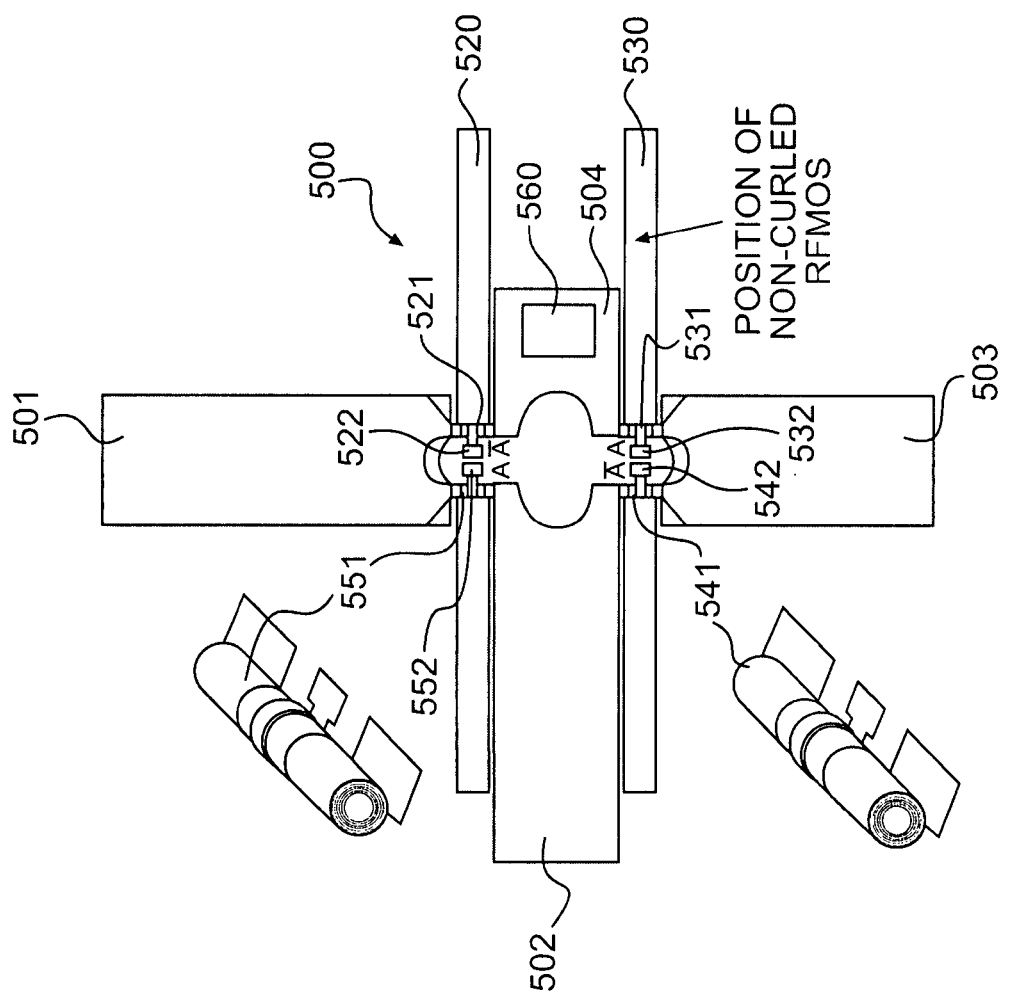
FIG. 5 illustrates a RF switch configuration incorporating four curled transistors, in accordance with an embodiment.

FIG. 5 shows a RF switch configuration 500 that may include four curled transistors 521, 531, 541 and 551. FIG. 5 also shows two uncurled footprints 520, 530 of the curled transistors 521 and 530, respectively. The RF switch 500 may be fabricated on a wafer and then release to form the curled transistors. The curled transistors 551 and 541 are shown enlarged for convenience. The curled transistors 521, 531, 541 and 551 are coupled to microwave strip lines (microstrips) 501, 502, 503 and 504, as shown. The curled transistors are coupled to the microstrips via their source and drain contacts. The microstrip 502 is the input for the switch 500 configuration and microstrips 501 and 503 are isolated outputs. Microstrip 504 is coupled to a ground contact 560. The curled transistors 521, 531, 541 and 551 include respective gate contacts 522, 532, 542 and 552.

In the RF switch configuration 500, shown in FIG. 5, the four individual transistors 521, 531, 541 and 551, coupled to microwave strip lines 501, 502, 503 and 504, may achieve the same circuit function as curled transistor arrangement 400, shown in FIG. 4.

In FIG. 5, the RF switch configuration 500 may represent a RF double pole double throw switch used in, for example, a digital True Time Delay (TTD) unit. This RF switch configuration takes an RF input signal moving along microstrip 502 and directs it down either microstrip output 501 or 503, with microstrip 504 being grounded for maximum signal isolation. In operation, if an RF signal from microstrip 502 is to be directed to microstrip 501, curled transistors 551 and 531 are turned "on" and curled transistors 521 and 541 are turned "off." Thus, signal from 502 passes through transistor 551 to microstrip 501. Microstrip 503 is coupled to ground microstrip 504 through curled transistor 531. In this example, curled transistors 521 and 541 are turned off, isolating microstrip 502 from microstrip 503 and isolating microstrip 501 from microstrip 504.

On the other hand, if the RF signal from microstrip 502 is to be directed to microstrip 503, curled transistors 521 and 541 are turned "on and curled transistors 551 and 531 are turned "off." Thus, signal from 502 passes through transistor 541 to microstrip 503. Microstrip 501 is coupled to ground microstrip 504 through curled transistor 521. In this example, curled transistors 531 and 551 are turned off, isolating microstrip 503 from microstrip 504 and isolating microstrip 501 from microstrip 502.

The circuit of FIG. 5 provides one half of a TTD or phase shift bit having particularly high isolation due to the series/shunt nature of the configuration.

Figure 6:
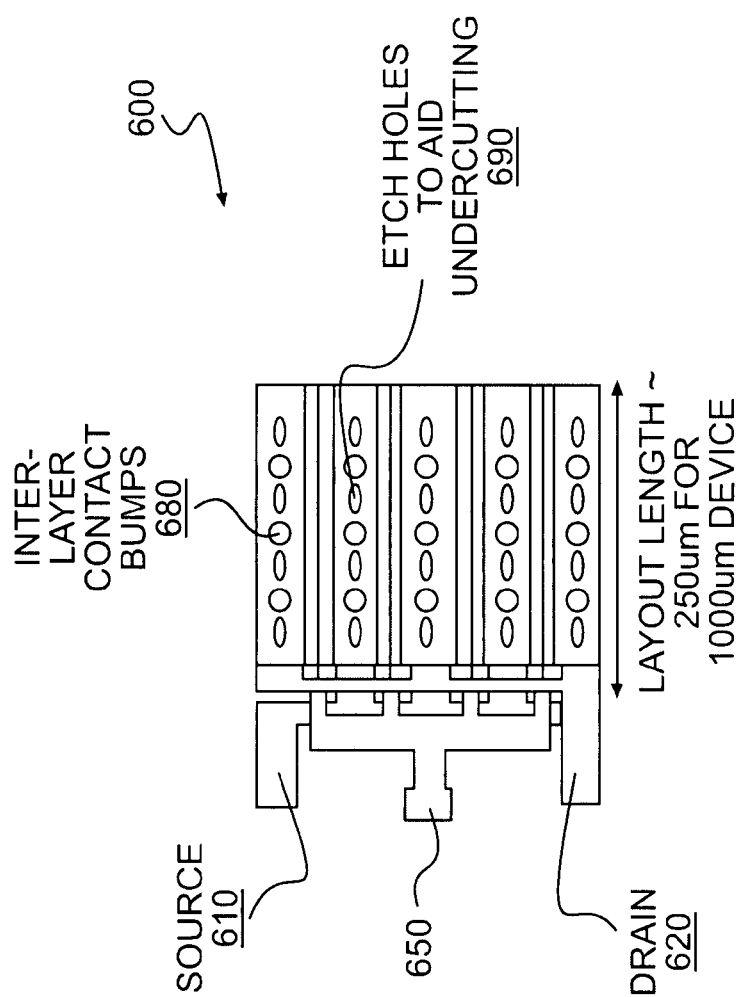
FIG. 6 illustrates a parallel transistor configuration, in accordance with an embodiment.

In an embodiment, a parallel configuration is used to reduce the single dimensional footprint of the uncurled transistor, enabling larger periphery devices while meeting dimensional constraints caused by circuit operational frequency demands (e.g., no dimension may be greater than a quarter wavelength of the maximum frequency in use). For example, transistor 600, shown in FIG. 6, is configured as four parallel layers that are stacked adjacent to or on top of each other. In this case, the footprint of the four layer transistor 600 may be reduced up to four times when compared to a device that is configured as a long transistor. For example, a 1000 μm long (uncoiled length) device can be reduced to a 250 μm long device, when configured as a parallel device. As shown, transistor 600 includes a four layer source that is coupled at source contact 610, a four layer drain coupled at drain contact 620 and four layered gate 650. Transistor configuration 600 includes bump-outs 680 inside source and drain regions, similar to the outside bumps shown in FIG. 2, which tie these internal parallel source and drain strips to themselves to minimize resistance along the path to the end of the coil. The parallel transistor configuration 600 may include holes 690, through the source and drain contacts, that may assist the undercut release etching, particularly for wider transistors. The configuration 600 showing a four layer (e.g., a 250 μm long) device may be configured for a 5 bit 20 Ghz TTD element, which requires smaller devices. Higher frequency TTD's (e.g., higher than 20 GHz) may require even a higher number of parallel paths to fit into a size consistent with the shortest highest bit segment.

Figure 7:
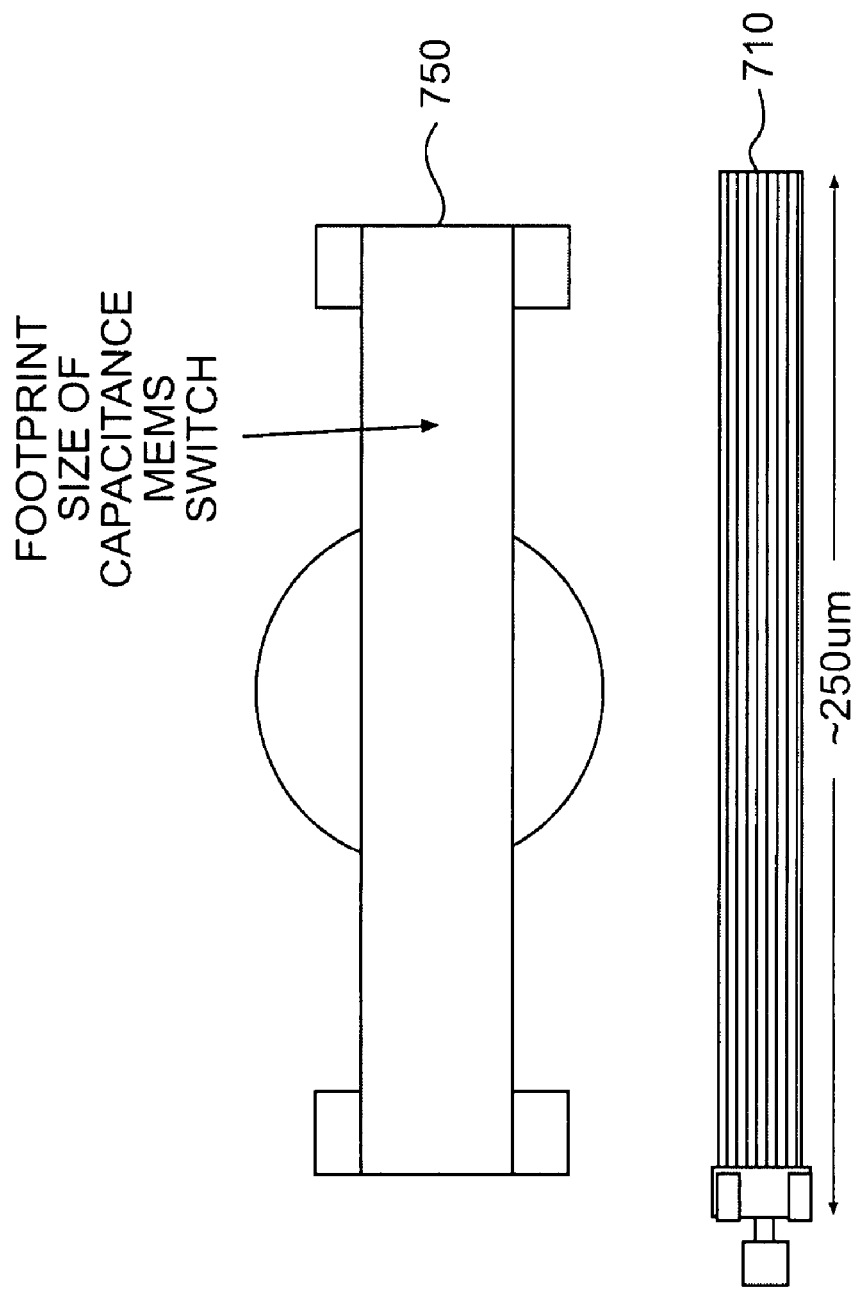
FIG. 7 illustrates a footprint comparison of a single parallel transistor configuration with a MEMS switch.

FIG. 7 illustrates a footprint of a single switch of a 4×250 μm long curled MOSFET 710 along side to scale the footprint of a normal capacitive MEMS (microscopic electromechanical systems) switch 750. It can be seen that the curled MOSFET 710 and MEMS switch 750 can be constructed with approximately the same footprint on an integrated circuit.

Because of the large periphery-to-output area ratio of the nanocoil MOSFET (approximately 10 um$^{-1}$), the off capacitance of the nanocoil for a given periphery is quite small. A cutoff frequency (Fco) of the nanocoil device can approach 5 to 10 THz when optimized (where $F_{co}=1/(2\pi R_{on}C_{off})$) and is related to the expected performance as an RF switch. The curled transistor, in accordance with an embodiment, may provide device performance for circuits requiring high isolation and low RF loss per bit.

Figure 8:
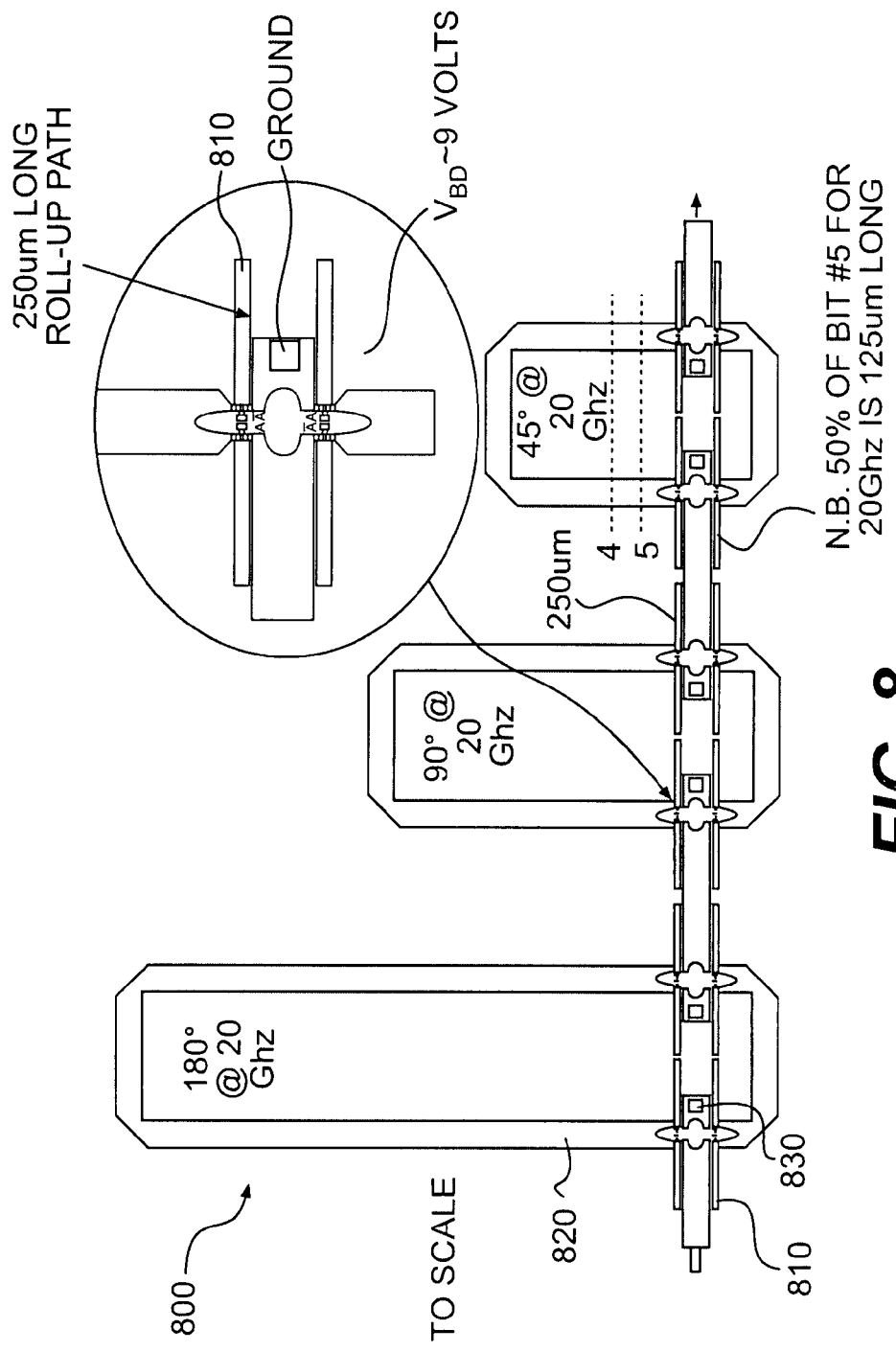
FIG. 8 illustrates a 3-bit circuit constructed with curled transistors, in accordance with an embodiment.

FIG. 8 illustrates a three bit True Time Delay circuit 800 constructed using nanocoil MOSFETS in the series/shunt configuration, configured to be compatible with a monolithic circuit. Circuit 800 shows uncurled transistors 810 coupled to the microwave strips lines 820 and coupled to ground vias 830, as shown. The DC control connections to the nanocoil curled MOS RF switches, shown in FIG. 8, are not shown. The circuit 800 may provide high isolation (e.g., >60 db) and low loss per bit (e.g., ~0.25 db) switch performance. Values of the "on" resistance Ron may be calculated to be approximately 2.5 Ohms and the "off" capacitance Coff may be approximately 0.006 pF for the theoretical cutoff frequency $F_{co}=10$ THz. The very low ideal "on" capacitance of 0.006 pF is a direct result of the predicted high Fco for the structure shown in FIG. 8.

In the FIG. 8 configuration, a minimum sheet resistivity of the 1000 μm periphery MOS device is assumed to be 5000 ohms/square. Silicon drive circuitry for the above 3 bit phase shifter can be jointly fabricated on the wafer. The sizes of an additional fourth and fifth bit are shown as dotted lines In FIG. 8.

Circuit 800 in FIG. 8 may be made on a high resistivity substrate material (>1000 ohm cm or more), such as SOI on high resistivity silicon or sapphire, if excessive losses in the microstrip delay lines is to be avoided.

Figure 9:
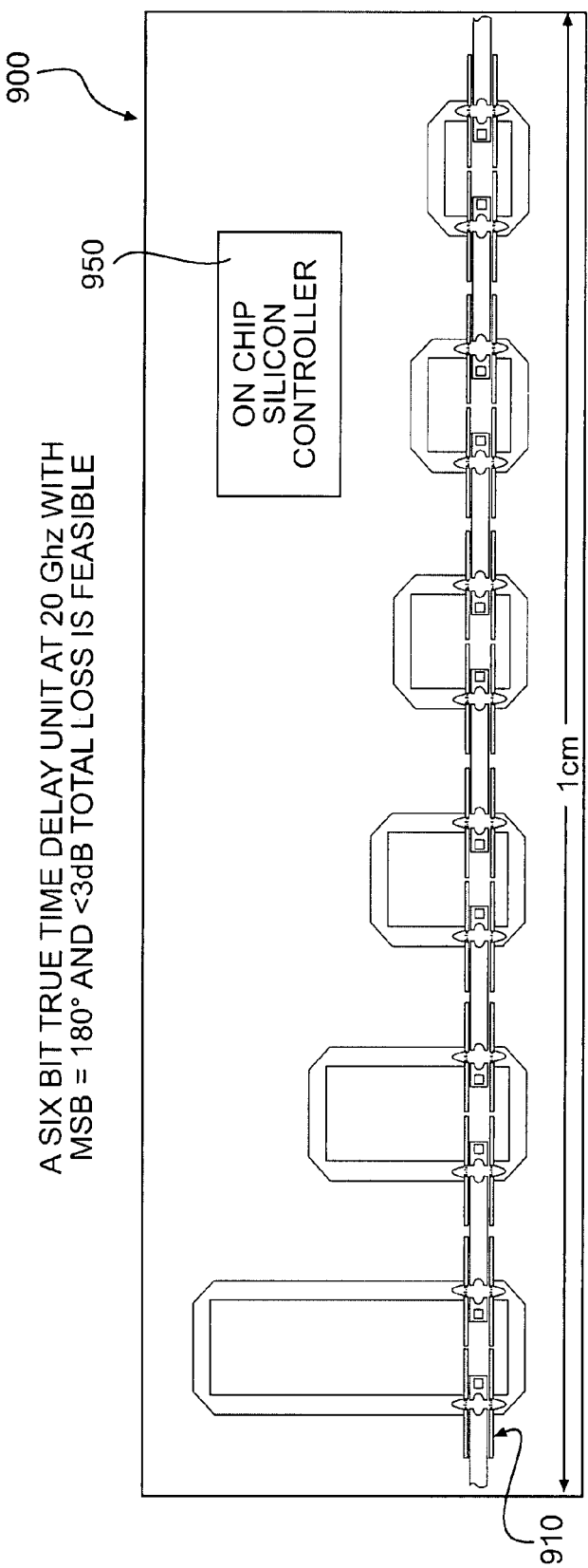
FIG. 9 illustrates a 6-bit circuit constructed with curled transistors, in accordance with an embodiment.

FIG. 9 illustrates a six bit phase shifter layout 900 utilizing nanocoil high Fco switches 910. As described above, a high resistivity substrate may be used for the circuit configuration due to the TTD delay lines. For example, a high resistivity Si substrate, in conjunction with a silicon germanium (SiGe) BiCMOS process using the low loss power nanocoil FETs, as described herein, and RF Switches and low loss microstrips, may be used for full logic, arithmetic and transmit/receive integration for RF devices. FIG. 9 shows the 6 bit phase shifter layout with a monolithic silicon decoder/controller 950.

Figure 10:
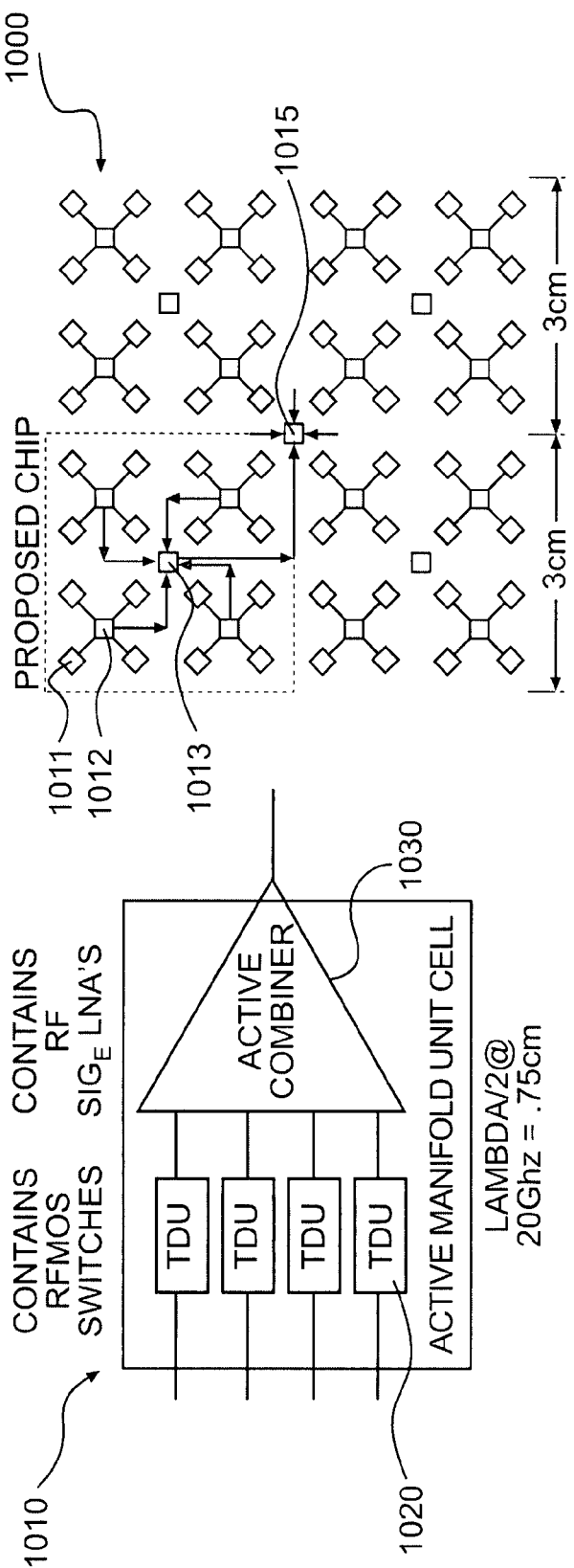
FIG. 10 illustrates a representative layout of a monolithic array of receiving elements in a RF system including curled transistors, in accordance with an embodiment.

FIG. 10 illustrates a representative layout of a monolithic array 1000 of receiving elements for achieving a wideband receiving array. The block diagram 1010 illustrates a four True Time Delays feeds 1020 to a low noise RF amplifier acting as an active combiner 1030. This active combiner 1030 can be fabricated by SiGe bipolar technology using typical heterojunction bipolar transistors (HBTs) (with FT values approaching 250 GHz) resident in a foundry. In this array, the four TTDs 1011 are connected through a TTD unit to an active combiner 1013 and four of the outputs of the active combiners are connected through individually adjustable delays to a next active combiner. The output of the active combiners are then fed to a central manifold 1015. The four outputs 1013 from the whole 6 cm×6 cm element are combined, for example, digitally to the receiver manifold 1015.

Figure 11:
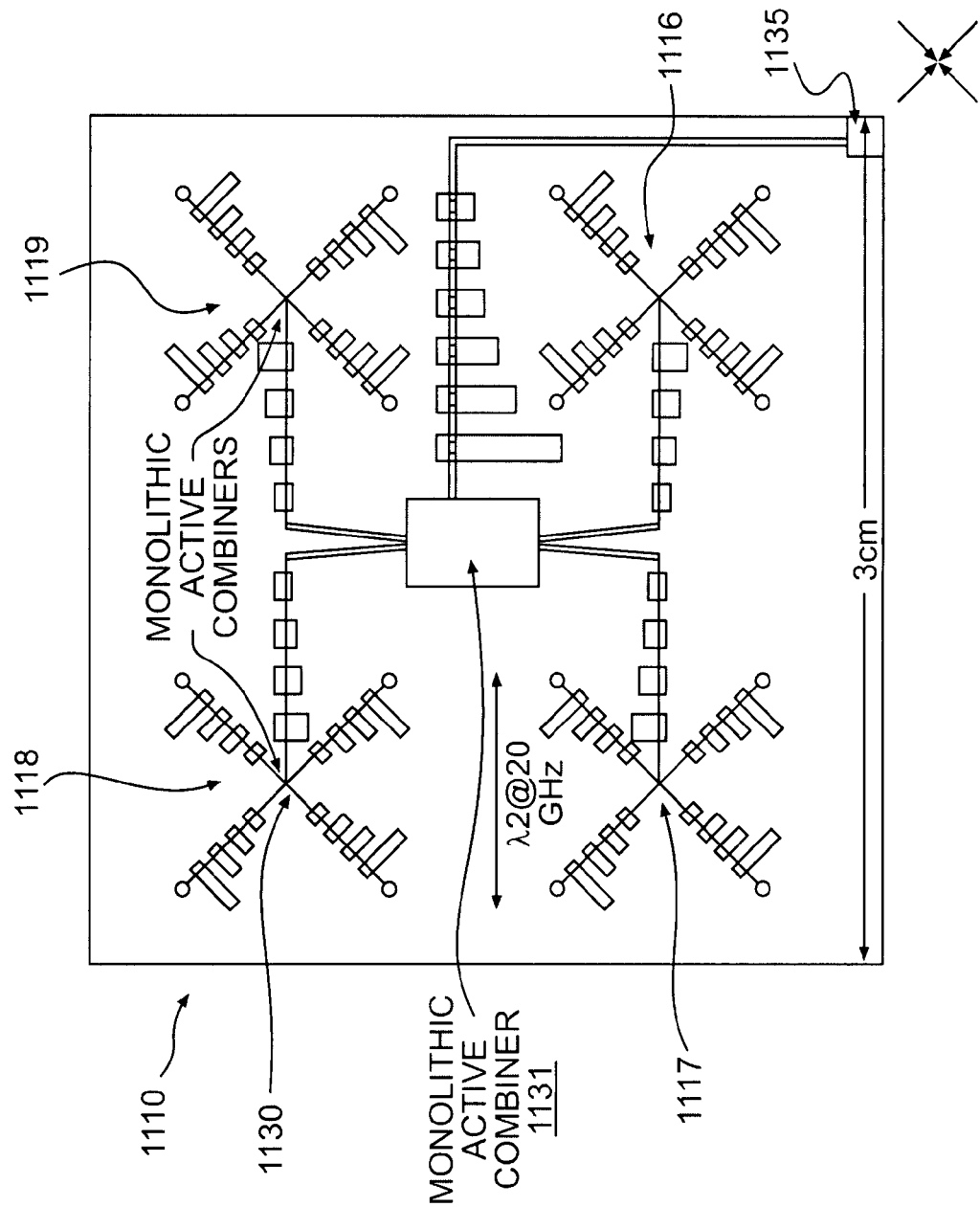
FIG. 11 illustrates a full function antenna array including curled transistors, in accordance with an embodiment.

In FIG. 11 illustrates a full function antenna array 1110 based on the circuit configuration 1000 of FIG. 10. Antenna array 1110 is a 16 element array. In antenna array 1110, four bit TDU's 1116, 1117, 1118 and 1119 may be utilized, and three levels of TDU delays each 2× the length of the previous one are on the chip. In addition regions for active combiners 1130, 1131 both at the first and second level may be included. Active combiners 1131 may be fed to a combination point 1135. In an embodiment, layout 1110 may be combined to for a larger antenna array assembly. For example, four antenna arrays 1000 may be combined into a 64 element assembly. These scalable 16 element arrays can be mass manufactured in a monolithic form, and machine assembled together to form a 64 element sub-arrays (not shown). A 16 element array contains 672 curled transistor switches (i.e., each bit contains 8 switches and each radiator contains 4 bits, thus the 16 element array chip contains 21×4×8=672 switches). A 64 element array would contain 2688 switches (4×672). A 672 switch layout shown in FIG. 11, is based on the small footprint of the nanocoil curled transistors, as described herein.

FIGS. 12 and 13 illustrates a process for fabricating a nanocoil curled transistor, in accordance with an embodiment. For convenience, digital control circuitry for the transistor or other device, being fabricated, maybe co-fabricated on the wafer, if desired. In this example, a Si based wafer using a SiGe BiCMOS process may be utilized to fabricate the nanocoil curled transistor(s) and control circuitry. FIGS. 12 and 13 also show post fabrication release and curl processes, in accordance with an embodiment.

FIGS. 12 and 13 show a top view 1291, a side view 1251 and a rear side view 1221. The fabrication process steps are referenced as 1280-1285. A silicon on insulator (SOI) wafer section 1231, includes a thin semiconductor substrate layer 1232, silicon dioxide layer 1233 and substrate layer 1234, as provided in process step 1280. The semiconductor substrate layer 1232 may be a single crystal silicon or polycrystalline silicon thin film. The semiconductor substrate layer 1232 may range in thickness from 250 Å to 2000 Å. The semiconductor substrate layer 1232 maintains its electrical properties even at this thickness. The substrate 1234 may be low doped Si or other high resistivity substrate. The high resistivity substrate provides a low capacitance to ground. The SOI wafer 1231 may be used for the transistor device fabrication as well as control circuitry fabrication, if desired. In this example, the semiconductor substrate layer 1232 may be approximately 1000 angstroms (Å) thick or more. Silicon dioxide 1233, buried between the semiconductor substrate layer 1232 and substrate layer 1234, may be, for example, approximately 500 Å thick, while the substrate layer 1234 may be approximately 700 μm thick. The measurements provided herein are given by way of example only, and these measurements may be varied as desirable. For example, the silicon layers can range from 25 nm to 200 nm, the oxide layers can range from 50 nm to 200 nm, and the substrate layers can range from 100 μm to 800 μm.

As shown in process step 1281, the silicon layers are etched to form curled transistor area (e.g., RFMOS transistors) 1265 and control circuitry area 1269. Top view 1291 shows four curled transistors 1261-1264 and control circuitry 1269 being fabricated on wafer 1231. As shown in process step 1282, active device areas including the source 1272, gate 1276, drain 1273, contacts 1274 and 1277 (with or without bump-outs (not shown)), and thin gate oxide 1275, of the curled transistors, are fabricated. Components of the control circuitry 1269 are also fabricated.

As shown in process step 1283, FIG. 13, a stressed nitride layer 1292 is deposited on the topside of the device area. As shown in process step 1284 (top view 1291), microwave strips 1293 are deposited on wafer 1231. The microwave strips 1293 may include chromium (Cr), gold. (Au), other metals or combinations thereof. The microwave strips 1293 are deposited to make contact to the transistor (e.g., 1261-1264) drain and source through vias along the length of the device. The uncurled transistors (e.g., 1261-1264) are released from the underlying substrate 1234, and because of the internal stresses due to the stressed nitride layer 1292, the transistors will curl, as shown in process step 1285. The curled transistors, such as transistors 1261-1262 are shown in FIG. 13. The transistors may be released using, for example, a wet release process or a dry process using $XeF_2$. The wet release process can be utilized for narrow device structures (e.g., having width <100 um) and may be carried out through an isotropic wet etch using HF acid. Alternatively, a dry DRIE (deep reactive ion etching) backside etch technique may also be used to release the transistor coils while retaining the buried oxide on the device underside for passivation. Another dry process could involve using $XeF_2$ and etching underneath the coiling areas by exploiting the very high selectivity of $XeF_2$ to etch silicon over silicon dioxide, in combination with encapsulating the to be released areas in silicon dioxide prior to release.

Other release techniques may be used to release the uncurled transistors from the underlying wafer. For example, techniques disclosed in the parent application may be used to release and curl the transistors. In addition, U.S. patent application Ser. No. 11/524,245, entitled "Microscopic Electro-Mechanical Systems, Radio Frequency Devices Utilizing Nanocoils and Spiral Pitch Control Techniques For The Same," U.S. patent application Ser. No. 11/524,246, entitled "Method For Fabricating Nanocoils," and U.S. patent application Ser. No. 11/524,244, entitled "Improved Nanocoils, Systems and Methods For Fabricating Nanocoils," disclose additional techniques that may be used for fabricating, releasing and curling nanocoils. All of these applications are hereby incorporated by reference in their entirety.

Once released from the substrate, the device layers are free to coil away from the substrate driven by the internal stress generated by the topside tensile stressed nitride. In an embodiment, metal end shorts (e.g., gold to gold) may be performed by plating additional metal (e.g., gold) to the edges of the device, such as device 1261.

An embodiment of the invention provides a coiled or curled transistor, such as a MOS transistor, that may be used for RF switching, for example. The curled transistor has small capacitance per unit periphery, from source-to-drain and from source/drain to substrate, leading to an RF switch with desirable isolation and low 'on' resistance.

Figure 14:
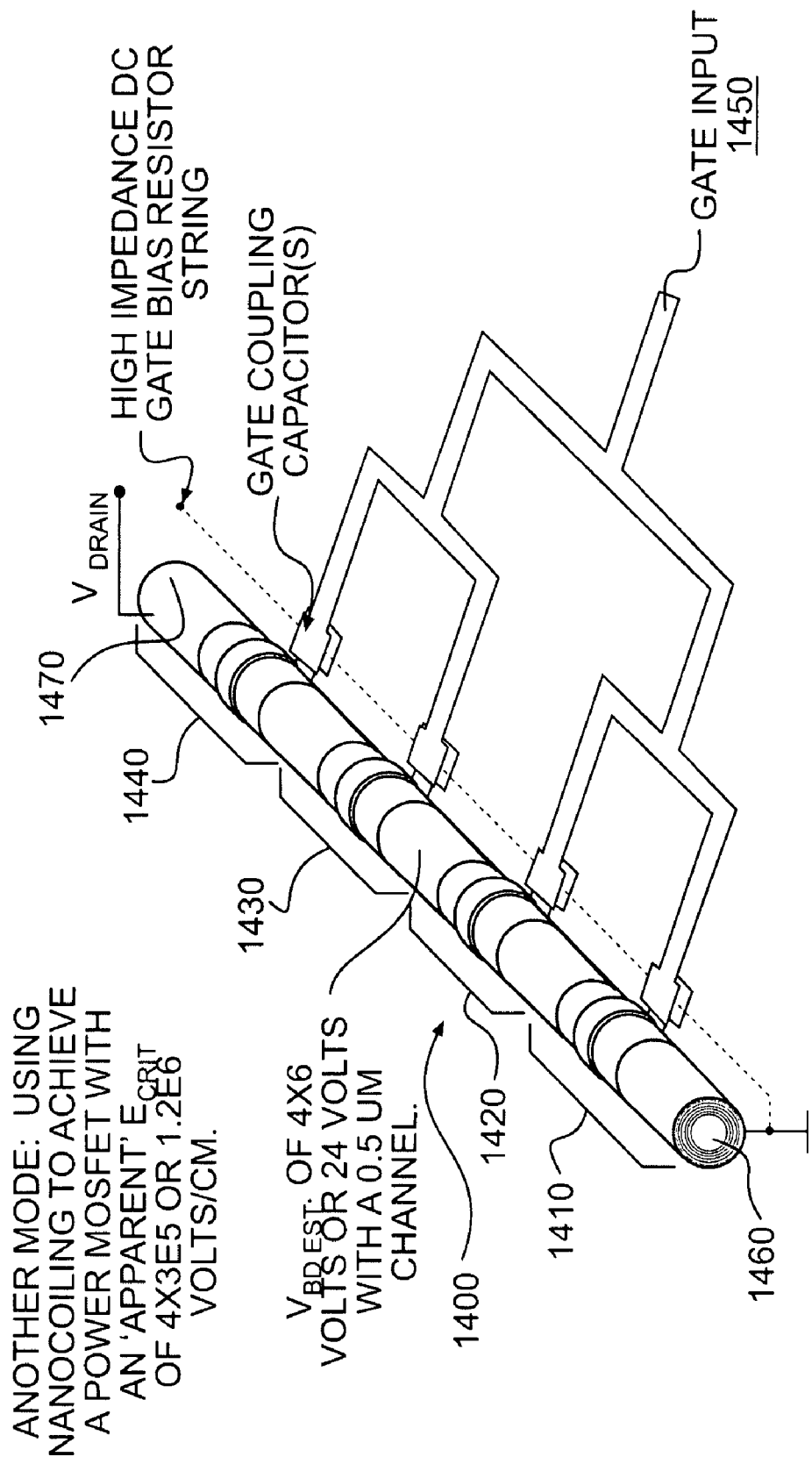
FIG. 14 illustrates a curled MOSFET power transistor arrangement, in accordance with an embodiment.

FIG. 14 shows a curled MOSFET power transistor 1400, in accordance with an embodiment. As shown, the curled MOSFET power transistor 1400 includes four transistors 1410, 1420, 1430 and 1440 coupled in series. The source and drain of successive transistors may be coupled to form the curled power transistor 1400. The gates of the curled transistors maybe connected as shown. The curled MOSFET power transistor 1400 has a source 1460, a drain 1470 and gate input 1450. The curled power transistor 1400, where N=4 is calculated to have a breakdown voltage of N*6 volts or 24 volts, where a conventional MOS device has a breakdown voltage of 6 volts. The higher breakdown voltage, such as for the curled power transistor 1400, offers power at a higher output impedance for larger bandwidth and lower matching losses. In addition, low capacitance to the substrate, as provided by the curled transistors, is desirable in a N series connection. Any number of curled transistors may be coupled in series to provide a curled power transistor.

Figure 15:
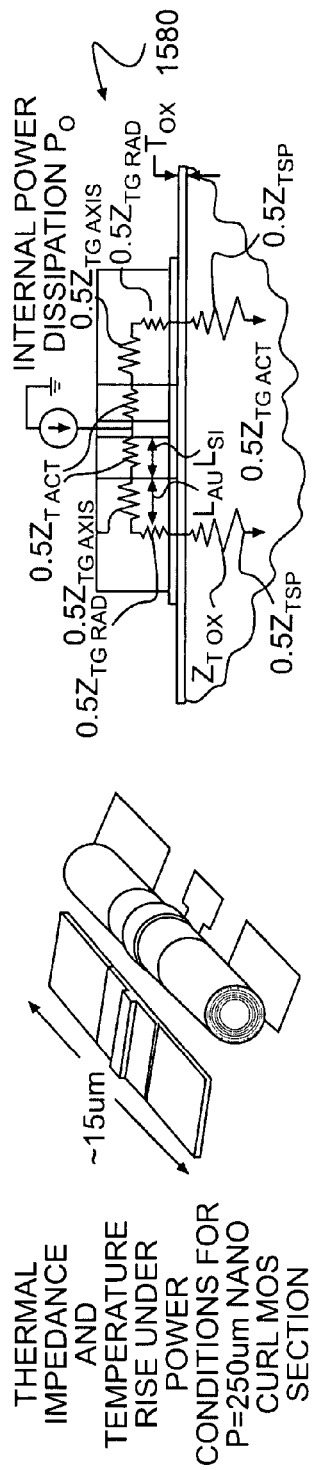
FIG. 15 illustrates the thermal impedance for a curled nanocoil transistor.

FIG. 15 illustrates a thermal impedance for a curled nanocoil transistor. FIG. 15 include a table that tabulates the thermal of the nanocoil, which can be broken down into five parts. As shown in the table, the thermal impedance is broken down to: 1) the thin silicon conductance path (1510); 2) the axial gold thermal path from the silicon edge to the center of the wound metal (e.g., gold) end cap (1520); 3) the radial thermal path to the bottom of the cap in contact with the silicon oxide underneath the MOSFET (1530); 4) the thermal impedance of the oxide insulator (1540); and 5) the silicon spreading thermal resistance into the substrate (1550). As an illustrative example, the table tabulates the thermal impedance and temperature rise for each of the five elements for a 75 milliwatt RF output wattage for each element of the N Series array. The values used for the length $L_{AU}$, shown in circuit configuration 1580, are 2.5 and 5 um. Note that up to a point, longer $L_{AU}$ values distribute the heat to ground better at the expense of total device length of the N Series device.

In one example, assuming a value of $L_{AU}$ of 5 um, the total thermal Z of a 75 mill watt device to ground is about 900° C./Watt, corresponding to a temperature rise above ground of 67° C., as shown in the table at 1560. Silicon can operate well up to 125° C. Note that the radial gold $Z_{TG}$ is the biggest contributor to thermal drop. A radial conductivity about 33% of a solid end cap is assumed for the above thermal impedance calculations. This value may be improved by adding an interlayer of deposited solder on each bump-out and using a post-process thermal flash to drop the temp rise by a factor of 2× or more to allow shorter end caps, and therefore shorter N series devices.

Figure 16:
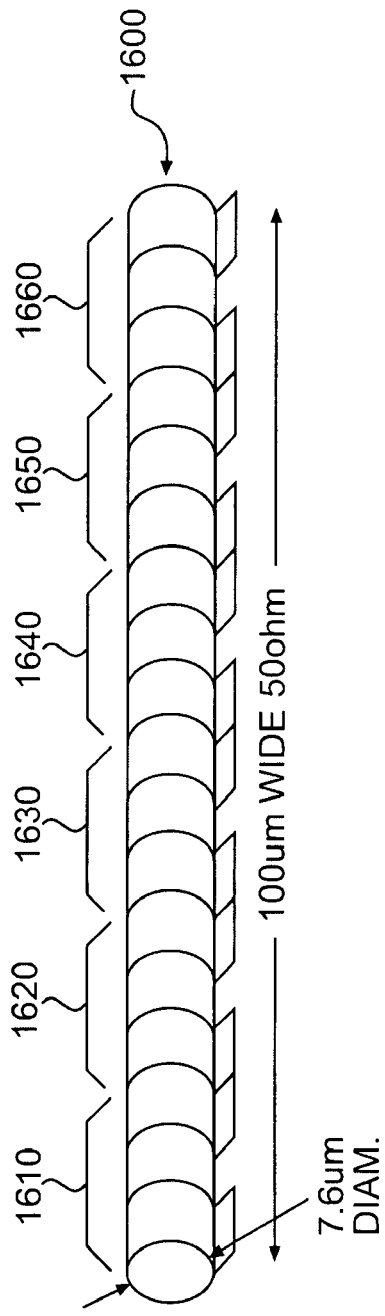
FIG. 16 illustrates a curled transistor arrangement, in accordance with an embodiment.

FIG. 16 a curled nanocoil MOSFET 1600 having six curled transistors (i.e., N=6) with an output power of about 450 mill watts in the 10 GHz range. The six transistor device 1600 includes transistor 1610, 1620, 1630, 1640, 1650 and 1660. The device 1600 may have a breakdown voltage of 36 volts (6*6 volts) and operates with a series current of 4 amps/cm× 250 μm or 100 mA. Based on calculations, the device may operate with a real load impedance of 36 volts/0.1 amp or 360 ohms, which may permit simple broadband coupling to a array radiating antenna which typically has an impedance of 377 ohms. In this example, the length of the curled nanocoil MOSFET 1600 may be about 100μm long. This curled nanocoil MOSFET 1600 may be used in a microwave delay or transmission line, which has microstrip width of about 100 μm. The power density into the footprint of a ~10 μm×100 μm long curled device is about 0.450 watts/(10 μm×100 μm) or 45000 watts/cm$^2$.

Several embodiments of the present invention are specifically illustrated and/or described herein. However, it will be appreciated that modifications and variations of the present invention are covered by the above teachings and within the purview of the appended claims without departing from the spirit and intended scope of the invention.

What is claimed is:

1. A curled transistor, comprising:
 a coiled semiconductor substrate having a plurality of concentrically curled layers;
 source and drain regions configured on a portion of the coiled semiconductor substrate;
 a gate dielectric positioned between the source and drain regions;
 a first set of metallic contacts electrically coupled to the source region on the coiled semiconductor substrate;
 a second set of metallic contacts electrically coupled to the drain region on the coiled semiconductor substrate; and
 a stressed layer disposed over a portion of the gate dielectric and portions of the first and second set of metallic contacts, wherein the stressed layer causes the semiconductor substrate to coil.

2. The curled transistor of claim 1, wherein a uncurled device thickness of the transistor ranges from 50 Å to 10,000 Å.

3. The curled transistor of claim 1, wherein the curled transistor comprises an outer diameter that ranges from 0.1 micrometers to 1000 micrometers.

4. The curled transistor of claim 1, wherein the curled transistor comprises an external length that ranges from 0.25 micrometer to 1 centimeter.

5. The curled transistor of claim 1, wherein in the first set of metallic contacts electrically couple to each other and the second set of metallic contacts electrically couple to each other in the curled transistor.

6. The curled transistor of claim 1, wherein the first set of metallic contacts and the second set of metallic contacts are electrically isolated from each other.

7. The curled transistor of claim 1, where the first set of metallic contacts electrically couple to each other to form a common source contact for the curled transistor.

8. The curled transistor of claim 1, where the second set of metallic contacts electrically couple to each other to form a common drain contact for the curled transistor.

9. The curled transistor of claim 1, further comprising:
 a first set of raised metallic bump-outs, wherein the first set of raised metallic bump-outs comprise a portion of the first set of metallic contacts and wherein the first set of raised metallic bump-outs permit the first set of metallic contacts to electrically couple to each other in the curled transistor.

10. The curled transistor of claim 1, further comprising:
 a second set of raised metallic bump-outs, wherein the second set of raised metallic bump-outs comprise a portion of the second set of metallic contacts and wherein the second set of raised metallic bump-outs permit the second set of metallic contacts to electrically couple to each other in the curled transistor.

11. The curled transistor of claim 1, wherein the first and second metal contacts are selected from a group comprising gold, aluminum, chrome, tungsten, titanium, and copper.

12. The curled transistor of claim 1, wherein the semiconductor substrate comprises single crystal silicon.

13. The curled transistor of claim 1, wherein the semiconductor substrate comprises polycrystalline silicon.

14. The curled transistor of claim 1 wherein the stressed layer is a stressed nitride layer.

15. A curled transistor, comprising:
a curled semiconductor substrate having a plurality of concentrically curled layers;
a first set of metallic contacts electrically coupled to a source region configured on the curled semiconductor substrate;
a second set of metallic contacts electrically coupled to a drain region configured on the curled semiconductor substrate, wherein in the first set of metallic contacts electrically couple to each other and the second set of metallic contacts electrically couple to each other in the curled transistor; and
a stressed layer disposed over the source and drain regions and portions of the first and second set of metallic contacts, wherein the stressed layer includes internal stresses that cause the semiconductor substrate to coil.

16. The curled transistor of claim 15, wherein a uncurled device thickness of the transistor ranges from 50 Å to 10,000 Å.

17. The curled transistor of claim 15, wherein the curled transistor comprises an outer diameter that ranges from 0.1 micrometers to 1000 micrometers.

18. The curled transistor of claim 15, wherein the curled transistor comprises an external length that ranges from 0.25 micrometer to 1 centimeter.

19. The curled transistor of claim 15, wherein the semiconductor substrate comprises single crystal silicon.

20. The curled transistor of claim 15, wherein the semiconductor substrate comprises polycrystalline silicon.

21. The curled transistor of claim 15 wherein the stressed layer is a stressed nitride layer.

* * * * *